United States Patent
Udupa et al.

(10) Patent No.: US 7,898,331 B2
(45) Date of Patent: Mar. 1, 2011

(54) INCREASING THE COMMON MODE RANGE OF A CIRCUIT

(75) Inventors: Anand Hariraj Udupa, Richardson, TX (US); Jagannathan Venkataraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/164,503

(22) Filed: Nov. 28, 2005

(65) Prior Publication Data

US 2007/0120595 A1    May 31, 2007

(51) Int. Cl.
*H03F 3/45* (2006.01)
(52) U.S. Cl. .............. 330/258; 250/214 A; 348/300
(58) Field of Classification Search ............ 330/258; 250/214 A; 348/300
See application file for complete search history.

(56) References Cited

U.S. PATENT DOCUMENTS

| 6,617,567 | B2 | 9/2003 | Mukherjee et al. |
| 6,774,722 | B2 * | 8/2004 | Hogervorst .......... 330/258 |

* cited by examiner

*Primary Examiner*—Michael B Shingleton
(74) *Attorney, Agent, or Firm*—John J. Patti; Wade J. Brady, III; Frederick J. Telecky, Jr.

(57) ABSTRACT

Increasing the input common-mode range of a circuit which accepts differential signals as inputs. Such an increase may be attained by correcting an input signal at continuous levels or at 2 or more discrete levels) without changing the strength represented by the input signal. In an embodiment, the common-mode component of an input signal is measured, and a correction voltage proportional to the difference between the measured common-mode component and a reference voltage, is generated. The correction voltage is coupled to the input terminals of the differential circuit to correct for any deviations from a desired level of common-mode voltage at the input terminals of the differential circuit. The approaches are applied to a switched-capacitor differential amplifier used in a sample-and-hold portion of an ADC.

15 Claims, 9 Drawing Sheets

INCREASING THE COMMON MODE RANGE OF A CIRCUIT

BACKGROUND

1. Field of the Invention

The present invention relates generally to the design of electronic circuits, and more specifically to a method and apparatus to increase the range of common mode voltages a circuit can operate with, while processing input signals.

2. Related Art

An electronic circuit generally accepts one or more input signals, processes them in some manner and correspondingly provides one or more output signals. For example, an amplifier may accept an audio signal and provide an amplified version of the audio signal as an output.

All signals in a circuit are referenced to one or more reference terminals, usually a ground terminal. For example, an input signal may be applied between an input terminal and a terminal connected to a ground reference point(circuit ground). The corresponding output signal may be provided between an output terminal and the circuit ground. An input (or output) signal which is referenced to a common ground terminal of a circuit(circuit ground) is called a single-ended signal.

In some environments, it is desirable to provide input signals to a circuit on terminals none of which are connected directly to circuit ground. This may be done in environments where the input signals are weak (low signal strength) and the entire circuit is operating in the presence of considerable noise (unwanted interfering signals).

For example, in a data-acquisition and control system, input signals may come from transducers located some distance from the main processing circuitry. Signals from transducers are typically low strength (weak) signals and may have to travel appreciable distances (through wires) before they can be processed.

In such environments, an input signal to a circuit is applied between two terminals (called differential input terminals), and the input signal is called a differential input signal and is not referenced to circuit ground. For example, a differential amplifier such as an operation amplifier (OPAMP) has two input terminals, inverting and non-inverting, between which a differential input signal may be applied. The OPAMP may amplify such a differential input signal and provide an output signal which may be single-ended or differential.

A differential signal (as in above environments) is characterized by a strength which equals the difference between the voltage(or current) values present on the two input terminals. The input signal may also contain a signal component which is common to both the input terminals. Such a common component is referred to as a common mode signal and is defined as the average of the voltage (or current) values present on the two input terminals.

A circuit such as an operational amplifier noted above may also receive single-ended input signals. In such a case, one input terminal of the circuit is connected to the single-ended signal and a second terminal of the circuit is connected to a reference voltage. Such a circuit is also characterized by a common-mode voltage (strength) at the two input terminals.

There has been a general constraint that the common-mode signal input (or equivalently the common-mode voltage/strength at the input terminals) to circuits (such as operational amplifiers) be limited to a certain range in order to ensure proper circuit functioning. For example, in the case of operational amplifiers there is a maximum specified common-mode voltage range for an input signal.

It is also desirable that the input common-mode range of a circuit (such as a differential amplifier) with differential (or single-ended) inputs be as high as possible, thus allowing a wide range of input signals to be processed. This is further described below with respect to an environment containing a sample-and-hold stage in an analog-to-digital converter (ADC).

FIG. 1 is a block diagram of a pipeline ADC in one embodiment illustrating the need to increase the input common mode range of an input (sample-and-hold circuitry) circuit. ADC 100 is shown containing sample and hold amplifier (SHA) 110, stages 120-1 through 120-S, digital error correction block 130 and reference buffer 150. Each block is described below in further detail.

Reference buffer 150 generates a reference voltage (Vref) on path 152 typically from a constant DC voltage (Vdc, e.g., bandgap reference voltage, well known in the relevant arts). Reference voltage (Vref) is used in various stages of the ADC for comparison against the signals at the respective inputs (on paths 111-1 through 111-S).

Digital error correction block 130 receives sub-codes from various stages (on paths 123-1 through 123-S respectively), and generates a digital code corresponding to the sample received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Each stage 120-1 through 120-S generates a sub-code (based on the reference signal Vref received on path 152) corresponding to a voltage level of an analog signal received as an input, and an amplified residue signal as an input to a (any) next stage. For example, stage 120-1 converts a voltage level on path 111-1 to generate a sub-code on path 123-1, and the amplified residue signal generated on path 111-2 is provided as an input to stage 120-2.

A common reference signal Vref is provided to stages 120-1 through 120-S. Each of stages 120-1 through 120-S may further contain various(logical) components such as a flash ADC, digital-to-analog converter (DAC), subtractor and gain amplifier as is well known in the relevant arts.

SHA 110 samples the input analog signal received on path 101 and holds the voltage level of the sample on path 111-1 for further processing. Path 101 contains two terminals between which an input differential signal may be applied. As noted above, the differential signals contain a common mode signal. The need for a high range of common mode signal can be better appreciated by examining the details and operation of SHA 110 in one embodiment.

Various terms used in the description and subsequent analysis are first listed below:

INP is the voltage at terminal 290-1
INM is the voltage at terminal 290-2
OUTP is the voltage at terminal 270-1
OUTM is the voltage at terminal 270-2
INP−INM represents the strength of the differential input signal received across terminals 290-1 and 290-2 and is the signal of interest.
OUTP−OUTM represents the strength of differential output signal provided across terminals 270-1 and 270-2 and is the signal of interest
INPCM=(INP+INM)/2, wherein INPCM is the common-mode voltage present in input signal applied across terminals 290-1 and 290-2
OUTCM is the common-mode voltage present at output terminals 270-1 and 270-2 due to application of an internally generated (in differential amplifier 260) reference voltage (REFCM). (In the interest of clarity, it is assumed for the purpose of this description that the output common mode feedback loop (noted earlier) is perfect, and that OUTCM gets set exactly to REFCM. For this reason, OUTCM and REFCM may be used interchangeably to refer to the same voltage.

REFCM(equal to (REFP+REFM)/2) is a common-mode voltage generated by internal (to differential amplifier 260) reference voltages REFP and REFM.

INCM is the common-mode voltage applied at input terminals (280-1 and 280-2) of differential amplifier 260 due to application of a reference voltage INCM and represents the value of the common-mode voltage that must be maintained at input terminals 280-1 and 280-2.

AMPINP is the voltage at 280-1 in the hold phase and AMPINM is the voltage at 280-2 in the hold phase. AMPCM is the effective common-mode voltage present at terminals 280-1 and 280-2 due to all sources of common-mode voltage (namely, INPCM, OUTCM and INCM) during the hold phase (between durations 391-392 of FIG. 3). AMPCM is equal to (AMPINP+AMPINM)/2.

Gd is the overall gain of the SHA 110 and is equal to (OUTP−OUTM)/(INP−INM).

Ao is the open loop differential gain of the differential amplifier 260 which is equal to (voltage at terminal 270-2−voltage at terminal 270-1)/(AMPINP−AMPINM)

FIG. 2 shows the internal details of SHA 110 in one embodiment. SHA 110 receives a differential input signal (that needs to be sampled at held for analog-to-digital conversion and further processing) across terminals 290-1 and 290-2 (logically contained in path 101), and is shown containing elements differential amplifier 260, switches 250-1, 250-2, 220-1, 220-2, 240-1 and 240-2, and capacitors 210-1, 210-2, 230-1 and 230-2. Each element is described below in further detail.

Differential amplifier 260 amplifies the difference of the voltages present across terminals 280-1 and 280-2, and provides an amplified output voltage across terminals 270-1 and 270-2. The differential output is connected (fed-back) to the terminals 280-1 and 280-2 through capacitors 210-1 and 210-2. Due to the feedback connection, differential amplifier 260 provides a differential output signal (across terminals 270-1 and 270-2), which is equal to the differential input signal. The differential output signal is used in subsequent stages (illustrated in FIG. 1) for further processing.

To ensure proper operation of differential amplifier 260, terminals 280-1 and 280-2 generally need to be maintained at a constant pre-determined bias potential. To achieve this, reference voltages are applied to terminals 280-1 and 280-2 through switches 220-1 and 220-2. Such an application causes a desired common-mode voltage to be maintained at terminals 280-1 and 280-2. The reference voltages noted above are selected such that the virtual ground nodes of the amplifier (280-1 and 280-2) are at an optimum value to ensure reliable operation. That is, the transistors contained in differential amplifier 260 are biased such that the amplifier operates with the desired high DC gain.

Similarly, the output terminals 270-1 and 270-2 of differential amplifier 260 may also need to be maintained at a constant pre-determined bias potential to ensure proper operation of any differential circuitry whose inputs may be connected to output terminals 270-1 and 270-2 of differential amplifier 260. This is achieved by a common mode feedback loop (not shown) which forces the output common mode which is equal to ((voltage at terminal 270-1+voltage at terminal 270-2)/2) to an internally generated voltage REFCM (equal to (REFP+REFM)/2).

Capacitors 230-1 and 230-2 represent parasitic capacitances at terminals 280-1 and 280-2 respectively. Switches 250-1, 250-2, 240-1 and 240-2, and capacitors 210-1, 210-2 operate to sample an input signal applied across input terminals 290-1 and 290-2 and hold the sampled value for amplification by differential amplifier 260. The manner in which this sample-and-hold operates is described below with reference to FIG. 3, which contains a timing diagram used to illustrate the sample and hold phases of SHA 110.

SHA 110 operates using two phases, shown in FIG. 3 as sampling phase 370 and hold phase 390. In the first phase (sampling phase 370) switches 250-1, 250-2, 220-1 and 220-2 are closed at time points 371 and the remaining switches 240-1 and 240-2 are kept open. As a result, capacitors 210-1 and 210-2 are ideally charged (in duration between 371-372) to the voltage of input signal present across terminals 290-1 and 290-2 by time point 372, and, 230-1 and 230-2 are ideally charged (in duration between 371-372) to the voltage (INCM) present at terminals 225-1 and 225-2.

In the second phase (between durations 391-392), feedback switches 240-1 and 240-2 are closed and switches 250-1, 250-2, 220-1 and 220-2 are kept open. This causes the output (across terminals 270-1 and 270-2) of amplifier 260 to take on a magnitude that is a function of the input signal (received on terminals 290-1 and 290-2), and the reference voltages INCM (applied on terminals 225-1 and 225-2) and OUTCM (applied on terminals 225-1 and 225-2). Expressions for the magnitude of the output voltage and the magnitudes of the differential and common-mode voltages at various nodes of SHA 110 are derived below.

As differential amplifier 260 is connected as a unity gain amplifier, the differential output voltage (OUTP−OUTM) is equal in magnitude to the differential input voltage (INP−INM), which is as required.

The common-mode voltages at various nodes are derived below. For the sake of clarity, voltages at various nodes are derived assuming only common-mode voltages are present.

During the sample phase switches 250-1, 250-2, 220-1 and 220-2 are closed, while switches 240-1 and 240-2 are open.

Therefore charge at each of input terminals 280-1 and 280-2 at the end of the sample phase is given by:

$$Q = C_s(\text{INCM} - \text{INPCM}) + C_p(\text{INCM}) \quad \text{Equation (1)}$$

During the hold phase, switches 240-1 and 240-2 are closed and switches 250-1, 250-2, 220-1 and 220-2 are open.

Therefore charge at each of input terminals 280-1 and 280-2 at the end of the hold phase is given by:

$$Q = C_s(\text{AMPCM} - \text{OUTCM}) + C_p(\text{AMPCM}) \quad \text{Equation (2)}$$

Input terminals 280-1 and 280-2 are high impedance nodes and hence charge at these nodes must be conserved. Therefore, equating equations 1 and 2 gives $$\text{AMPCM} = \text{INCM} + \left(\frac{\text{OUTCM} - \text{INPCM}}{C_s + C_p}\right) C_s \quad \text{Equation (3)}$$

Thus, it may be seen that due to the feedback of the output signal and application of an input signal, AMPCM has a value different from the required value of INCM, the difference being equal to $(\text{OUTCM} - \text{INPCM}) C_s / (C_s + C_p)$.

As may be seen from the above description, large variations in INPCM, cause correspondingly large variations in AMPCM, thereby affecting the normal operation of differential amplifier 260 and limiting its use to cases where the common-mode voltages in the input signal fall within a narrow range of values.

However, input signals can be received with a wide range of common mode voltages on path 101, for example, because the input signal may have been generated in an earlier circuit which is referenced to a different ground potential (in comparison with SHA 110). Alternatively, common noise component might have been added as common mode voltage on both terminals 290-1 and 290-2.

Various aspects of the present invention operate to increase the input common-mode range of a circuit (e.g., SHA 110) which accepts differential signals as inputs.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
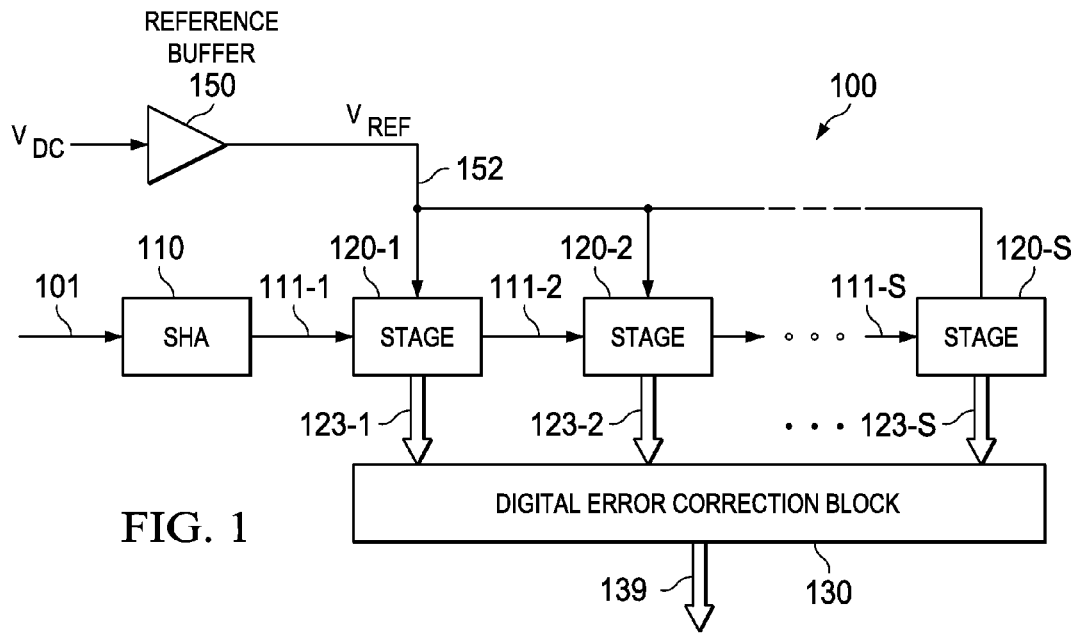
FIG. 1 is a block diagram illustrating an example environment in which various aspects of the present invention can be implemented.

According to an aspect of the present invention, a correction voltage which corrects an input signal by a voltage level (one of more than 2 levels) proportionate to the common mode voltage of the input signal is applied to ensure that a corrected signal (generated from the input signal) has a constant common mode voltage. As a result, any circuit processing the corrected signal can be implemented independent of the level of the common mode voltage (within a range) of the input signal. Thus, the overall circuit can be implemented with an input signal having a wide range of common mode voltages.

In an embodiment (described below in further detail), such a feature is obtained by measuring the voltage level of the common mode present on an input differential signal, and generating a difference voltage between such a common-mode voltage and a reference voltage. This difference voltage is amplified by a suitable factor to generate a correction voltage, which is subtracted from the common-mode voltage present in the input signal so as to maintain the common-mode voltage presented to the input terminals of a circuit at a constant pre-determined level.

Thus, as long as the common-mode voltage on the input signal is within a certain limit, the common-mode voltage of the output/corrected signal presented for further processing is maintained constant. This allows the overall solution to be used with input signals that may contain a wider range of common-mode voltages without affecting the operation of the circuit.

In an embodiment that contains a sample-and-hold amplifier using switched-capacitor techniques, input common-mode voltage at the differential inputs is maintained constant by: (1) applying a correction voltage through a capacitor of a suitable value to one input terminal of the amplifier during the hold phase; (2) applying the same correction voltage through a capacitor of
the same value to the second input terminal of the amplifier during the hold phase of operation; and (3) applying a reference voltage to each of the two input terminals through the same set of capacitors during the sample phase of operation.

In another embodiment of the above-noted sample-and-hold amplifier, input common-mode voltage at the differential inputs is maintained constant by: (1) applying a correction voltage through a capacitor of a suitable value to one input terminal of the amplifier during the hold phase; (2) applying the same correction voltage through a capacitor of the same value to the second input terminal of the amplifier during the hold phase of operation; and (3) applying an opposite correction voltage to each of the two input terminals through the same set of capacitors during the sample phase of operation.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

2. Generating Correction Voltages

With respect to equation 2, it may be appreciated that if the term $(OUTCM-INPCM)C_s/(C_s+C_p)$ is cancelled or its magnitude reduced by a suitable approach, then the input signal may be allowed to contain a wider range of common-mode voltages (represented by INPCM) without affecting the operation of a differential circuit such as SHA 110.

This is achieved according to an aspect of the present invention by generating a correction voltage and canceling the undesirable component of common-mode voltage $(OUTCM-INPCM)C_s/(C_s+C_P)$, as is described further below with reference to FIGS. 4A and 5.

Figure 4A:
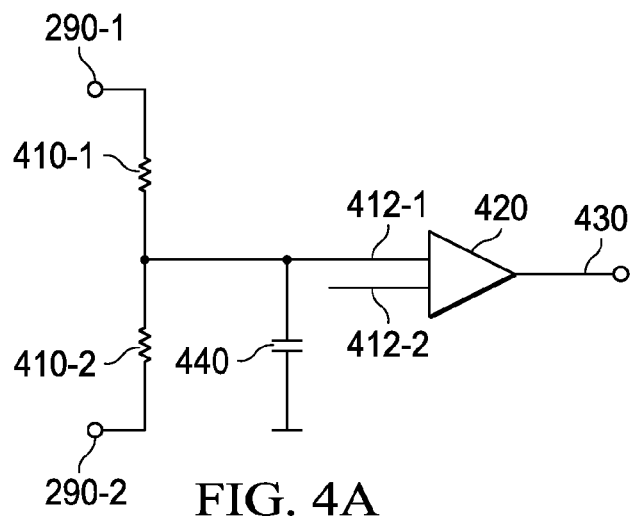
FIG. 4A is a schematic diagram illustrating the manner in which a correction voltage in a single ended form may be generated to correct for a common-mode voltage in an input signal in one embodiment.

FIG. 4A contains a circuit (correction signal generator) that may be used to generate the correction voltage noted above and may be implemented internally in SHA 110. Merely for illustration, the circuit is described in the context of FIGS. 1-2 described above. However, the features can be implemented in various other environments, as will be apparent to one skilled in the relevant arts by reading the description provided herein. The circuit is shown containing differential amplifier 420, resistors 410-1 and 410-2 and capacitor 440. Each element is described below in further detail.

Resistors 410-1 and 410-2 have the same value and are used to form a voltage divider network to generate a voltage on path 412-1 which is the average (and therefore equal to the common mode voltage) of the voltages present on terminals 290-1 and 290-2.

Capacitor 440 is connected between path 412-1 and ground, and in combination with resistors 410-1 and 410-2 acts as a low pass filter. Such a combination, therefore, measures an "average" value of the input common mode (on terminals 290-1 and 290-2) and makes such a value available on path 412-1. The time period of this average is proportional to the filter time constant as set by the product of the values of resistors 410-1/410-2 and capacitor 440.

Differential amplifier 420 is used to amplify the difference between the inputs at terminals 412-1 and 412-2 by a required gain. The circuitry used to set the required gain is not shown, as being well understood to one skilled in the relevant arts.

When an input signal containing a common voltage INPCM is applied across terminals 290-1 and 290-2, the resistive divider network formed by resistors 410-1 and 410-2 generates a voltage equal to INPCM on path 412-1. A voltage equal to the output common-mode voltage OUTCM (which is forced to REFCM by an internally generated voltage because of the common mode feedback loop mentioned earlier) of differential amplifier 260 is applied at terminal 412-2.

Differential amplifier 420 amplifies the difference of OUTCM and INCM by a required factor to generate a correction voltage, that is, the output of amplifier 420 has a value $(OUTCM-INPCM)*G$, wherein G is the gain of differential amplifier 420.

Figure 2:
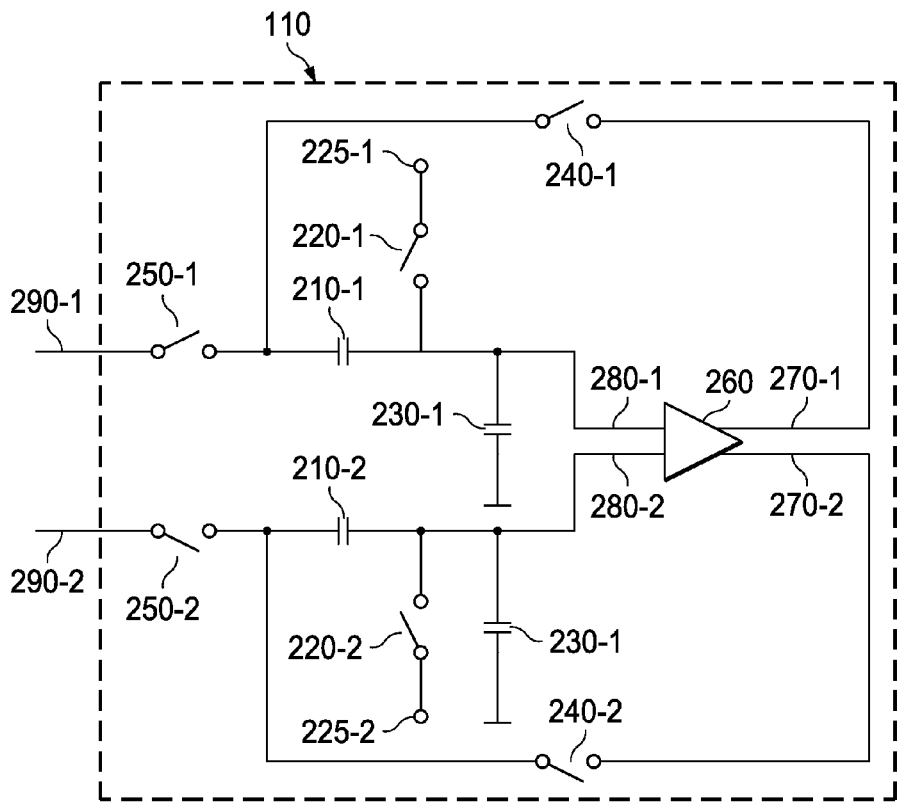
FIG. 2 is a schematic diagram of a prior sample-and-hold amplifier.
Figure 3:
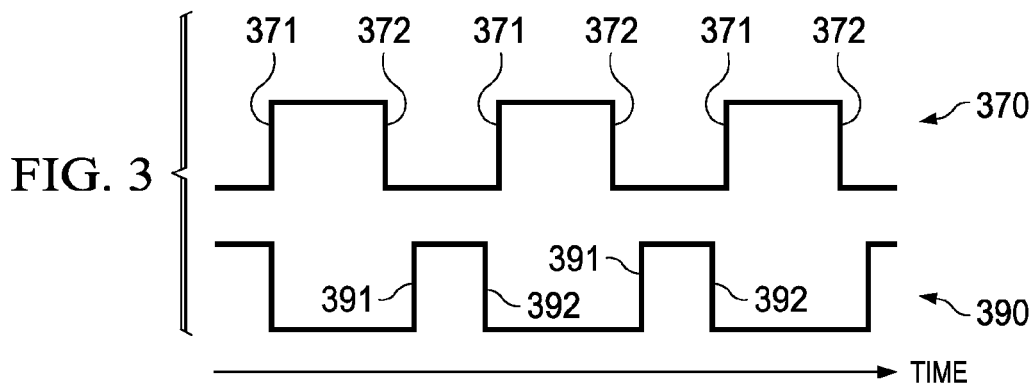
FIG. 3 is a timing diagram illustrating the sample and hold phases of a sample-and-hold amplifier.

Referring to equation 3, it may be seen that if the gain G in amplifier 420 is set to $C_s/(C_s+C_P)$, then the output of differential amplifier 420 will be equal to $(OUTCM-INPCM)C_s/(C_s+C_P)$, which is the undesirable component of the common-mode voltage present at the input terminals 280-1 and 280-2 of differential amplifier 260 of FIG. 2. If this output of differential amplifier 420 is subtracted from the effective value of common-mode voltage AMPCM, then the common-mode voltage at input terminals 280-1 and 280-2 may be maintained at the desired value represented by INCM.

While the circuit of FIG. 4A generates the correction voltage in a single-ended form, it should be appreciated that some circuits (e.g., the circuit of FIG. 7, described below) may need the output in differential form. An embodiment of such circuit generating the correction voltage in differential form is described below in further detail.

Figure 4B:
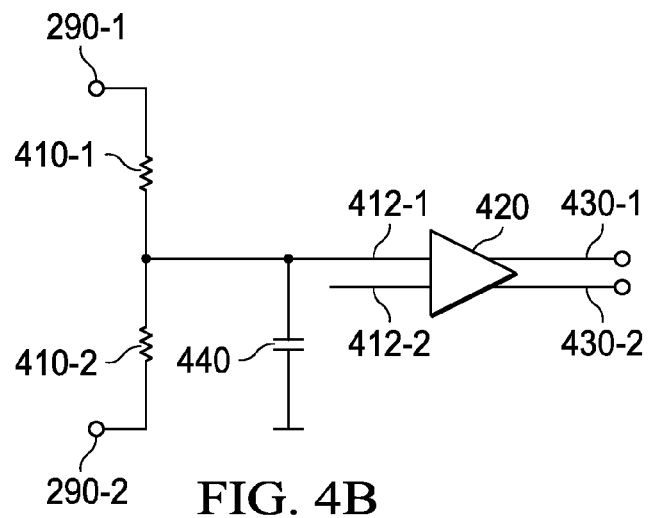
FIG. 4B is a schematic diagram illustrating the manner in which a correction voltage in a differential form may be generated to correct for a common-mode voltage in an input signal in one embodiment.

FIG. 4B contains circuitry substantially similar to that of FIG. 4A and a detailed description is not provided here in the interest of conciseness. The only difference from FIG. 4A is that output terminals 430-1 and 430-2 of differential amplifier 420 provide correction voltages (INCORRP and INCORRM, referred to in the description below) in differential form.

The manner in which the correction voltage generated using the approach(es) described above is used to increase the input common mode range is described below with reference to FIG. 5.

3. Applying Correction Voltage to Increase Input Common-Mode Range

Figure 5:
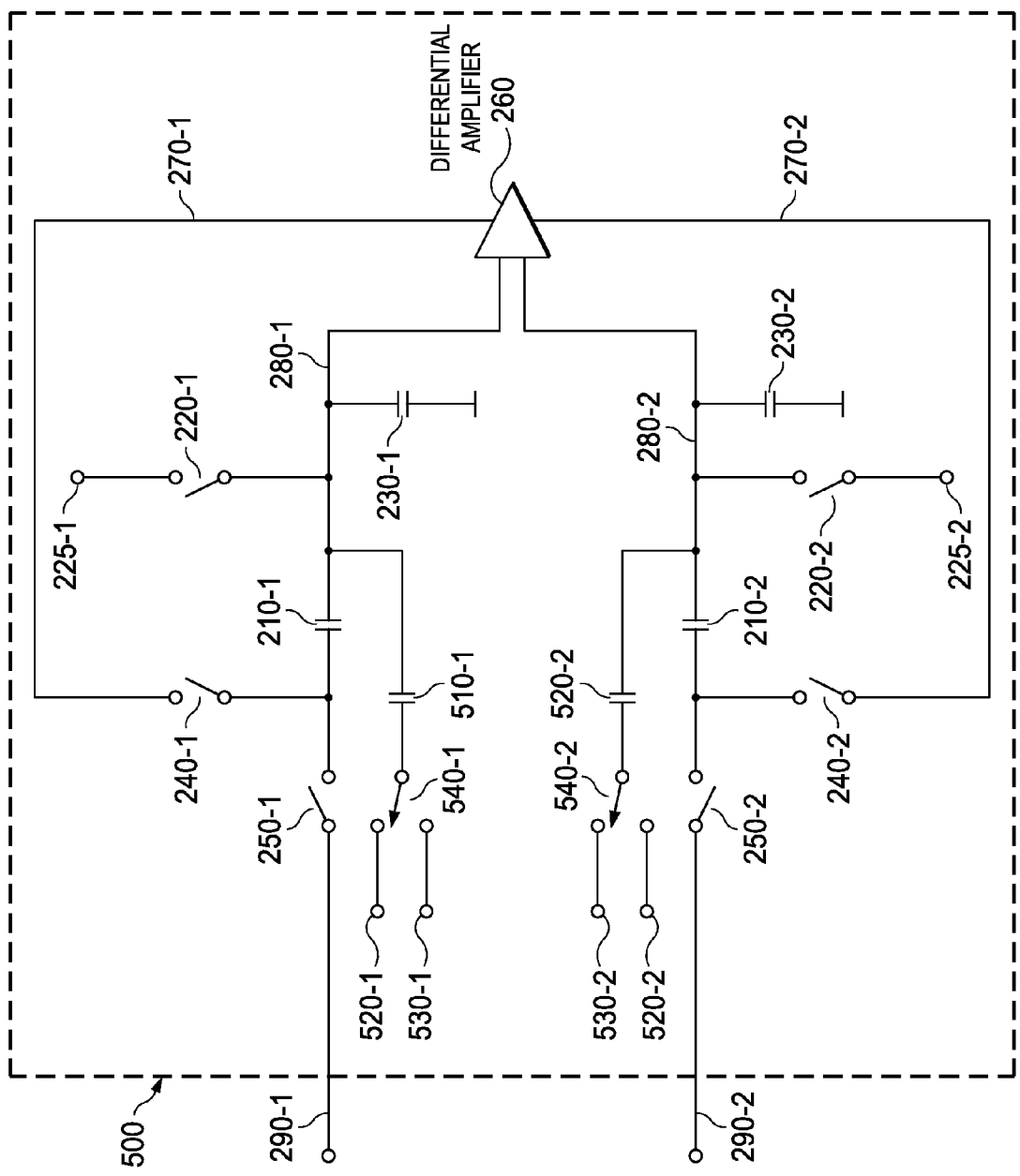
FIG. 5 is a schematic diagram illustrating a correction circuitry which may be used to correct for a common-mode voltage in an input signal in one embodiment.

FIG. 5 contains a circuit used to apply a correction voltage to maintain the common-mode voltage at the input terminals of a differential amplifier at a constant value. For conciseness and clarity, some of the components of FIG. 2 are shown retained in FIG. 5. Thus, sample and hold amplifier (SHA) 500 (which can be used in place of SHA 110) is shown containing differential amplifier 260, switches 250-1, 250-2, 220-1, 220-2, 240-1, 240-2, 540-1 and 540-2, and capacitors 210-1, 210-2, 230-1, 230-2, 510-1 and 510-2.

Differential amplifier 260, switches 250-1, 250-2, 220-1, 220-2, 240-1 and 240-2, and capacitors 210-1, 210-2, 230-1 and 230-2 operate similar to in FIG. 2, and the corresponding description is not repeated in the interest of conciseness.

In the descriptions to follow input signal refers to a signal applied across terminals 290-1 and 290-2, and a corrected signal (in terms of its common mode voltage) refers to a signal across terminals 280-1 and 280-2, whose common-mode strength has been corrected to a desired level.

Switches 540-1 and 540-2 and capacitors 510-1 and 510-2 comprise a correction circuitry, which operate to increase the input common-mode range of SHA 500 as described below.

During the sample phase of operation of SHA 500, switches 540-1 and 540-2 are connected to terminals 520-1 and 520-2 respectively. During the hold phase of operation of SHA 500, switches 540-1 and 540-2 are connected to terminals 530-1 and 530-2 respectively.

Terminals 520-1 and 520-2 are connected to reference voltage REFCM (an internally generated voltage). Terminals 530-1 and 530-2 are connected to a correction voltage (VCORR) which may be generated internally in SHA 500 in a suitable manner using the approaches described above with respect to FIG. 4A. It is now shown below, how the application of a correction voltage in the circuit of FIG. 5 maintains the common-mode voltage constant. For the sake of clarity, voltages at various nodes are derived assuming only common-mode voltages are present.

Charge at each of input terminals 280-1 and 280-2 at the end of the sample phase is given by:

$$Q = C_s(\text{INCM}-\text{INPCM}) + C_p(\text{INCM}) + C_x(\text{INCM}-\text{OUTCM}) \qquad \text{Equation (4)}$$

Charge at each of input terminals 280-1 and 280-2 at the end of the hold phase is given by:

$$Q = C_s(\text{AMPCM}-\text{OUTCM}) + C_p(\text{AMPCM}) + C_x(\text{AMPCM}-\text{VCORR}) \qquad \text{Equation (5)}$$

The charge at input terminals 280-1 and 280-2 must be conserved (as noted earlier). Therefore equating equations 3 and 4 and re-arranging the terms gives:

$$AMPCM = INCM + \frac{(OUTCM - INPCM) * C_S}{C_s + C_p + C_x} -$$
$$OUTCM * \frac{C_x}{C_s + C_p + C_s} - \frac{VCORR * C_x}{C_s + C_p + C_x}$$

Equation (6)

From equation 6, it may be seen that if (VCORR*Cx) is equal to (OUTCM*(Cs+Cx)−INPCM*Cs), then AMPCM will be maintained at a level equal to INCM, which is the desired level. Equation 7 below gives the required expression:

$$C_x * VCORR = ((OUTCM - INPCM) * C_s) - OUTCM * C_x$$

Equation (7)

The values of Cx and VCORR may be suitably chosen to achieve the above requirement.

Though it is possible to maintain AMPCM at the desired common-mode level by choosing values of VCORR and Cx according to the equations described above, the disadvantages with having larger values of Cx is that it affects the closed loop bandwidth, the distortion and the differential gain (Gd) of differential amplifier 260, as is described below with reference to FIGS. 6A and 6B. An expression for closed loop bandwidth and Gd is derived below in order to show its dependence on the value of Cx. Voltages at input terminals 280-1 and 280-2 are represented by V+ and V− respectively.

Figure 6A:
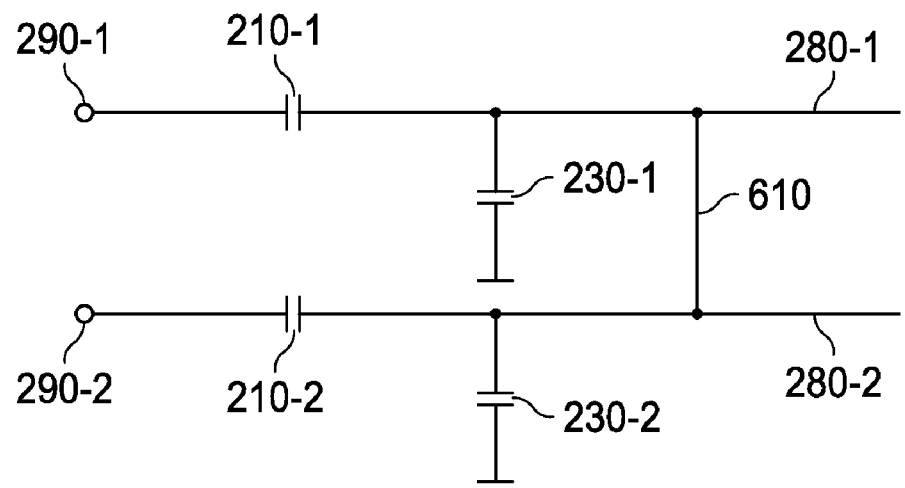
FIG. 6A is an equivalent circuit of a sample-and-hold amplifier during a sample phase in one embodiment.
Figure 6B:
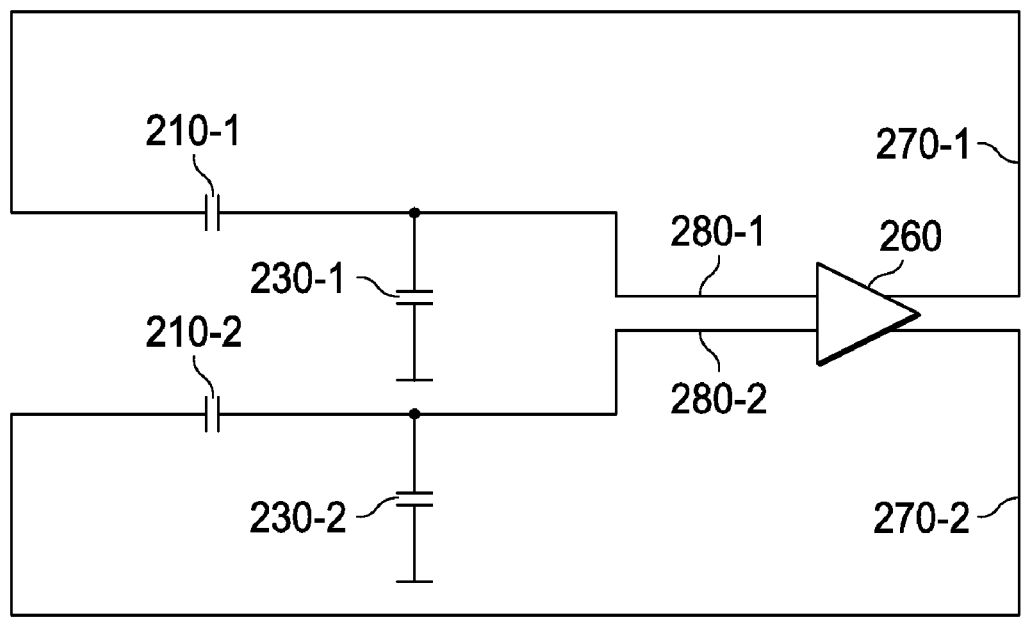
FIG. 6B is an equivalent circuit of a sample-and-hold amplifier during a hold phase in one embodiment.

FIGS. 6A and 6B show equivalent circuits of a portion of SHA 500 showing inputs and outputs of differential amplifier 260 during the sample phase and hold phase respectively. Dotted line 610 represents the virtual short between input terminals 280-1 and 280-2 of differential amplifier 260.

From FIG. 6A:

$$C_s(INCM - INP) + C_p INCM = C_p V^+ + C_s(V^+ - OUTM)$$

Equation (8)

From FIG. 6B:

$$C_s(INCM - INM) + C_p INCM = C_p V^- + C_s(V^- - OUTP)$$

Equation (9)

Subtracting equation 9 from equation 8 gives:

$$C_s(INM - INP) = C_p(V^+ - V^-) + C_s(V^+ - V^-) + C_s(OUTP - OUTM)$$

Equation (10)

Further:

$$(V^+ - V^-) * (-A_o) = OUTP - OUTM$$

Equation (11)

Rearranging the terms in equation 11 gives:

$$(V^+ - V^-) = \frac{OUTP - OUTM}{-A_o}$$

Equation (12)

wherein $A_0$ is the open-loop gain of differential amplifier 260.

Substituting the expression for $(V^+ - V^-)$ from equation 12 in equation 10 gives:

$$C_s(INP - INM) = C_p\left[\frac{OUTP - OUTM}{A_0}\right] +$$
$$C_s\left[\frac{OUTP - OUTM}{A_0}\right] + C_s(OUTP - OUTM)$$

Equation (13)

Rearranging the terms of equation 13 gives:

$$C_s(INP - INM) = (OUTP - OUTM)\left[\frac{C_s}{A_o} + \frac{C_p}{A_o} + C_s\right]$$

Equation (14)

Rearranging the terms of equation 14 gives:

$$(OUTP - OUTM) = \frac{(INP - INM)}{\left[1 + \frac{1}{A_0} + \frac{C_p}{C_s A_0}\right]}$$

Equation (15)

When correction is applied using a correction voltage VCORR in the manner described earlier, the relation represented by equation 15 becomes:

$$(OUTP - OUTM) = \frac{(INP - INM)}{\left[1 + \frac{1}{A_0} + \frac{C_p}{C_s A_0} + \frac{C_x}{C_s A_0}\right]}$$

Equation (16)

From equation 16, it may be seen that overall transfer function of the SHA is given by:

$$\frac{(OUTP - OUTM)}{(INP - INM)} = \frac{1}{\left[1 + \frac{1}{A_0} + \frac{C_p}{C_s A_0} + \frac{C_x}{C_s A_0}\right]}$$

Equation (17)

If the open-loop gain $A_0$ of differential amplifier 260 were infinite, then Gd would be equal to unity since terms containing $A_0$ would be equal to zero, and output differential voltage would be equal to input differential voltage, as required.

However, as $A_0$ has a finite value, it may be seen from equation 18 that Gd would be less than one.

Therefore, it may be appreciated that to achieve a gain Gd which is as close to unity as possible, Cp and Cx must have very small values. (Cp is chosen to have a value as small as possible).

Further, substituting Ao=Adc/(1+s/$\omega_p$), wherein Adc is the open loop DC gain of the differential amplifier and $\omega_p$ is the pole of the amplifier) gives:

$$\frac{OUTP - OUTM}{INP - INM} = 1/[1 + (C_S + C_P + C_X)/C_S * A_{dc} +$$
$$s/(A_{dc} \cdot \omega_p \cdot (C_S + C_P + C_X)/C_S)]$$

Equation 17A wherein the closed loop bandwidth is equal to the [Adc·$\omega_p$·Cs/(Cs+Cp+Cx)]

So as the value of Cx increases the closed loop bandwidth becomes less and more power is needed. Also the factor Cs/(Cs+Cp+Cx) being small causes less distortion suppression by the amplifier.

It may be appreciated from the above description that a choice of a large value of Cx to order to satisfy the requirement of equation 7 will affect closed loop bandwidth, distortion and closed loop differential gain Gd.

Therefore, an improved approach to maintaining a constant common-mode voltage at the input terminals of differential amplifier 260 may be used and is described below with reference to FIG. 7.

4. Improved Approach to Applying Correction Voltage

Figure 7:
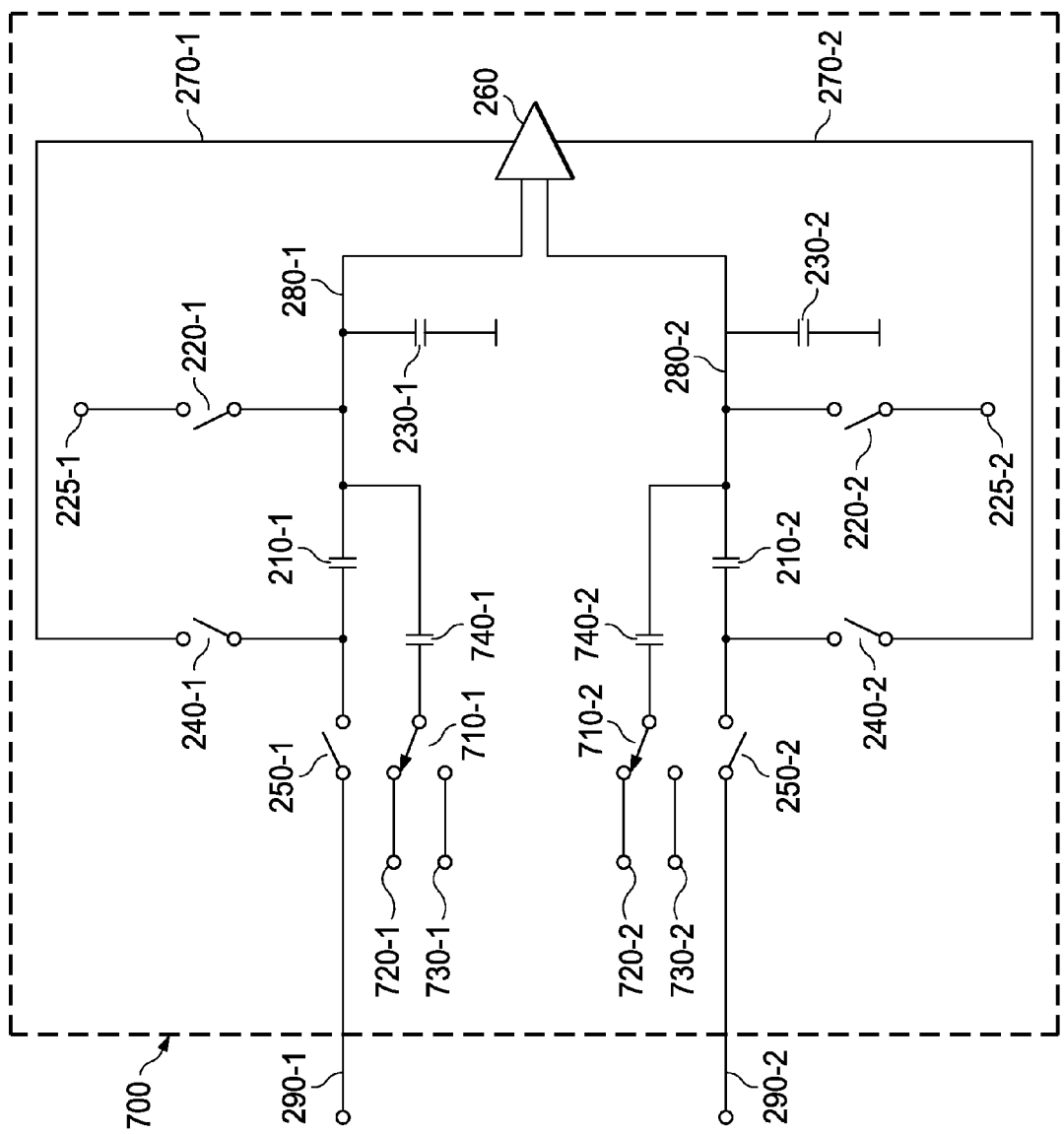
FIG. 7 is a schematic diagram illustrating a correction circuitry in a second embodiment which may be used to correct for a common-mode voltage in an input signal.

FIG. 7 is a circuit diagram of a sample and hold amplifier (SHA) illustrating the manner in which correction voltage can be applied without affecting differential gain of the SHA. Sample and hold amplifier SHA 700 (which can be used in place of SHA 110) is shown containing differential amplifier 260, switches 250-1, 250-2, 220-1, 220-2, 240-1, 240-2, 710-1 and 710-2, and capacitors 210-1, 210-2, 230-1, 230-2, 740-1 and 740-2. Each component is described below in further detail.

Differential amplifier 260, switches 250-1, 250-2, 220-1, 220-2, 240-1 and 240-2, and capacitors 210-1, 210-2, 230-1 and 230-2 operate similar to as described above with respect to FIG. 2, and the description is not repeated in the interest of conciseness.

Switches 710-1 and 710-2, and capacitors 740-1 and 740-2 comprise a correction circuitry, which operate to increase the input common-mode range of SHA 700 as described below.

During the sample phase of operation of SHA 700, switches 710-1 and 710-2 are connected to terminals 720-1 and 720-2 respectively. During the hold phase of operation of SHA 700, switches 710-1 and 710-2 are connected to terminals 730-1 and 730-2 respectively.

Terminals 720-1 and 720-2 are connected to a correction voltage INCORRP. Terminals 730-1 and 730-2 are connected to a correction voltage INCORRM. INCORRP and INCORRM may be generated internally in SHA 700 in a suitable manner. One such approach is to generate INCORRP and INCORRM as a differential voltage riding on a common mode voltage.

that is,

INCORRP=VCOMMON+VCORR

INCORRM=VCOMMON−VCORR     Equation 18A wherein INCORRP and INCOOM may be generated as described above with reference to FIG. 4B.

It is now shown below, how the application of correction voltages INCORRP and INCORRM in the circuit of FIG. 7 maintains the common-mode voltage constant. For the sake of clarity, voltages at various nodes are derived assuming only common-mode voltages are present.

Charge at each of input terminals 280-1 and 280-2 at the end of the sample phase is given by:

$Q=C_s(INCM-INPCM)+C_p INCM+C_x(INCM-INCORRP)$     Equation (18)

Charge at each of input terminals 280-1 and 280-2 at the end of the hold phase is given by:

$Q=C_s(AMPCM-OUTCM)+C_p AMPCM+C_x(AMPCM-INCORRM)$     Equation (19)

Charge at input terminals 280-1 and 280-2 must be conserved (as noted earlier). Therefore equating equations 18 and 19 and re-arranging the terms gives:

$C_s(INCM-INPCM)+C_p INCM+C_x(INCM-INCORRP)=C_s(AMPCM-OUTCM)+C_p AMPCM+C_x(AMPCM-INCORRM)$     Equation (20)

Rearranging the terms of equation 20 gives:

$(C_s+C_p+C_x)(INCM)-C_s(INPCM)-C_x(INCORRP)=AMPCM(C_s+C_p+C_x)-C_s(OUTCM)-C_x(INCORRM)$     Equation (21)

Therefore, from equation 21 and equation 18A AMPCM is given by $$AMPCM = INCM + C_s \frac{(OUTCM - INPCM)}{C_s + C_p + C_x} - 2C_x \frac{VCORR}{C_s + C_p + C_x}$$     Equation (22)

From equation 22, it may be seen that if the value of (Cs*(OUTCM−INPCM)) is made equal to the value of (2*Cx*VCORR), then AMPCM becomes equal to INCM, which is the desired value.

To satisfy the above requirement, the values of Cx and VCORR may be chosen as described below.

A value of Cx may be chosen such that Cx=Cs/G, where G is a large gain value. With Cx being made equal to Cs/G, the required value of correction voltage VCORR becomes equal to G/2*(OUTCM−INPCM).

That is:

$$C_x = C_s/G;$$

$$VCORR = \frac{G}{2}(OUTCM - INPCM)$$     Equation (23)

The required value of VCORR (as given by equation 23) may be generated in a manner described with respect to FIG. 4A. INCORRP and INCORRM may be generated satisfying the relation given by equation 18A by any of well known approaches.

Thus, input common-mode range may be improved by generating and applying a correction voltage. Effect on differential gain can be avoided by applying equal and opposite voltages appropriately during the sample and hold phases through low-valued capacitors, as described above.

The above described technique uses differential amplifier 420 in the correction generation circuitry. Differential amplifier 420 is typically chosen to be a low speed amplifier in order to minimize power consumption. Therefore, the technique described above applies a correction voltage which is proportional to an average value of common mode voltage on an input signal.

In environments where the common-mode voltage on an input signal varies significantly over time periods which are of the same order as the sample and hold phases (of differential amplifier 260), it is desirable to correct for such variations in short durations. For example, in an environment where the input is a single ended signal (one terminal of differential amplifier 420 receiving such an input and the other terminal of differential amplifier 420 tied to a constant voltage), the input common mode could vary significantly between successive cycles.

The technique described above will require a high power differential amplifier for generating the correction voltage fast enough to track the input common mode variations. As such, it is desirable to correct for common-mode variations on an input signal on a cycle-by-cycle basis (i.e., at every sample or hold phase) using a different approach. This is described below with respect to another aspect of the present invention.

5. Providing Cycle-by-Cycle Correction for Input Common-Mode Voltage

Figure 8A:
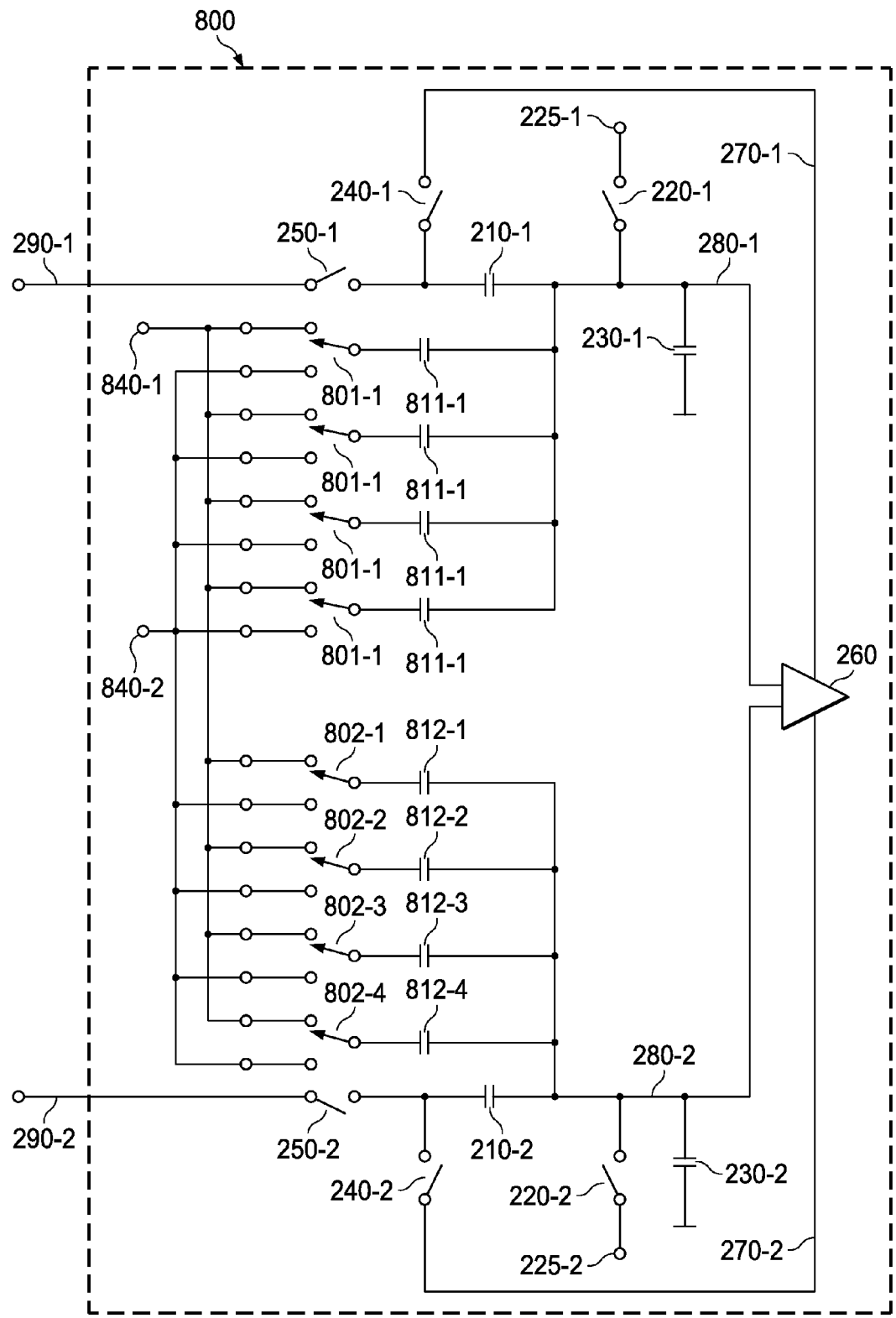
FIG. 8A is a schematic diagram illustrating a correction circuitry which may be used to correct for a common-mode voltage in an input signal received in differential form in a third embodiment.

FIG. 8A is a circuit diagram of a sample and hold amplifier (SHA) illustrating the manner in which correction voltages can be applied on a cycle-by-cycle basis. Sample and hold amplifier SHA 800 (which can be used in place of SHA 110)

is shown containing differential amplifier 260, switches 250-1, 250-2, 220-1, 220-2, 240-1, 240-2, 801-1, 801-2, 801-3, 801-4, 802-1, 802-2, 802-3 and 802-4, and capacitors 210-1, 210-2, 230-1, 230-2, 811-1, 811-2, 811-3, 811-4, 812-1, 812-2, 812-3 and 812-4. Each component is described below in further detail.

Differential amplifier 260, switches 250-1, 250-2, 220-1, 220-2, 240-1 and 240-2, and capacitors 210-1, 210-2, 230-1 and 230-2 operate similar to as described above with respect to FIG. 2, and the description is not repeated in the interest of conciseness.

Switches 801-1 through 801-4 and 802-1 through 802-4 are used to apply a correction voltage REFP (present on terminal 840-1) or REFM (present on terminal 840-2) to each of correction capacitors 811-1 through 811-4 and 812-1 through 812-4. REFP (840-1) and REFM (840-2) are generated internally in differential amplifier 260 in order to maintain the common-mode voltage at output terminals 270-1 and 270-2 at a constant level equal to (REFP+REFM)/2 (also equal to OUTCM).

The common-mode voltage on an input signal (on terminals 290-1 and 290-2) is measured during the sample phase and correction is applied during the hold phase.

A measurement circuitry determines the input common-mode voltage and contains logic which connects switches 801-1 through 801-4 and 802-1 through 802-4 to either REFP or REFM.

Five levels of correction voltage may be applied based on the following switch connections:

The 5 levels are as follows:

1. All eight of capacitors 801-1 through 801-4 and 802-1 through 802-4 connected to REFP.
2. Any three of capacitors 801-1 through 801-4 connected to REFP, remaining one of capacitors 801-1 through 801-4 connected to REFM, any three of capacitors 802-1 through 802-4 connected to REFP, remaining one of capacitors 802-1 through 802-4 connected to REFM.
3. Any two of capacitors 801-1 through 801-4 connected to REFP, remaining two of capacitors 801-1 through 801-4 connected to REFM, any two of capacitors 802-1 through 802-4 connected to REFP, remaining two of capacitors 802-1 through 802-4 connected to REFM.
4. Any one of capacitors 801-1 through 801-4 connected to REFP, remaining three of capacitors 801-1 through 801-4 connected to REFM, any one of capacitors 802-1 through 802-4 connected to REFP, remaining three of capacitors 802-1 through 802-4 connected to REFM.
5. All eight of capacitors 801-1 through 801-4 and 802-1 through 802-4 connected to REFM.

Thus, five levels of correction are applied based on the measured input common-mode voltage.

As mentioned earlier, the addition of these extra capacitors have an undesirable effect on the gain as well as bandwidth of the amplifier. So it is desirable to make these capacitors smaller. One way to do this is by choosing a high value of REFP and a low value of REFM. This results in a reduction in the value of the capacitors for the same range of correction.

The technique of FIG. 8A can be extended to the case when an input signal is single ended, and is briefly noted below with respect to FIG. 8B.

Figure 8B:
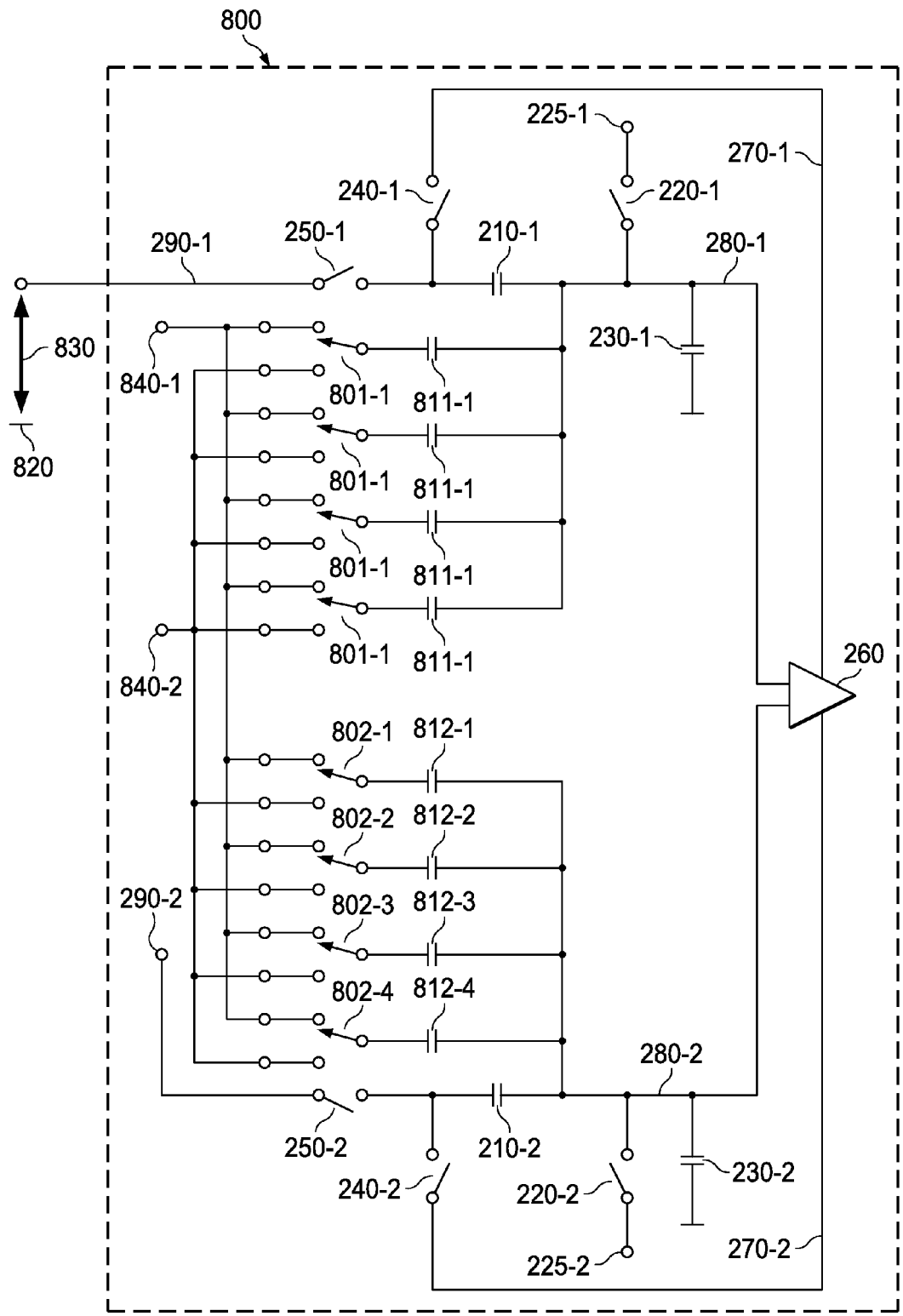
FIG. 8B is a schematic diagram illustrating a correction circuitry which may be used to correct for a common-mode voltage in an input signal received in single ended form in a third embodiment.

FIG. 8B shows the circuit of FIG. 8A receiving a single ended signal. Since the internal details of the circuit of FIG. 8B are substantially the same as that of FIG. 8A, in the interest of conciseness only the differences will be noted below.

As illustrated by arrow 830, a single-ended input signal is applied across path (terminal) 290-1 and a ground terminal 820. A constant voltage is applied on terminal (path) 290-2.

SHA 800 of FIG. 8B works in a manner similar to the description of FIG. 8A, and is not repeated here in the interest of conciseness.

The measurement circuitry and switch control logic used in the correction procedures described thus far are described next with respect to FIG. 9.

6. Measurement Circuitry and Switch Control Logic

Figure 9:
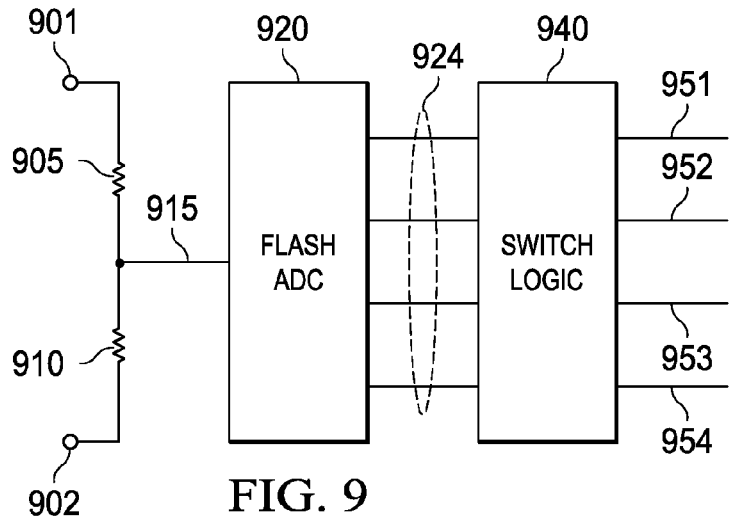
FIG. 9 is a block diagram illustrating the manner in which a correction voltage may be generated by activating the appropriate switches shown in FIGS. 8A and 8B.

FIG. 9 is a block diagram of a circuit that may be used for measuring the input common-mode voltage and appropriately connecting correction capacitors 811-1 through 811-4 and 812-1 through 812-4 (of FIGS. 8A and 8B) to either REFP or REFM. The block diagram is shown containing resistors 905 and 910, flash ADC 920 and switch logic 940.

Resistors 905 and 910 have the same value and are used to form a voltage divider network to generate a voltage on path 915 which is the average (and therefore equal to the common mode voltage of the input signal) of the input voltage present on terminals 905 and 910.

Flash ADC 920 converts the voltage on path 915 and generates an equivalent digital representation which is forwarded to switch logic 940 on path 924. Flash ADC 920 is shown as an ADC having 4 threshold levels. This results in a total of 5 different possible corrections based on the range of the input.

Switch logic 940 generates signals 951 through 954 which control connection of correction capacitors 811-1 through 811-4 and 812-1 through 812-4 (of FIGS. 8A and 8B) to either REFP or REFM. Switch logic 940 may be implemented using any of several well known approaches.

Flash ADC and switch logic 940 are high speed devices, while they consume low power (in comparison with differential amplifier 260 of FIGS. 4A and 4B). Therefore switches 811-1 through 811-4 and 812-1 through 812-4 (of FIGS. 8A and 8B) can be operated at a rate equal to the sample and hold phases of differential amplifier 260, and correction can be applied on a cycle-by-cycle basis while maintaining the power consumption of the correction circuitry low.

From the above described sections it may be seen that correction may be applied either at continuous levels or discrete levels in order to maintain the input common-mode voltage substantially constant. Example figures may be used to illustrate such correction graphically as shown below.

7. Graphical Illustration of Correction of Input Common-Mode Voltage

Figure 10A:
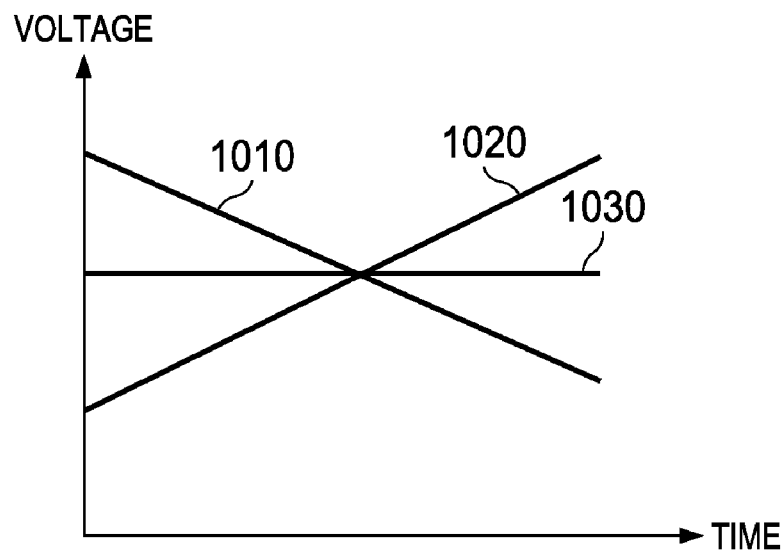
FIG. 10A is a graph illustrating the manner in which correction voltage is at continuous levels in an embodiment of the present invention.
Figure 10B:
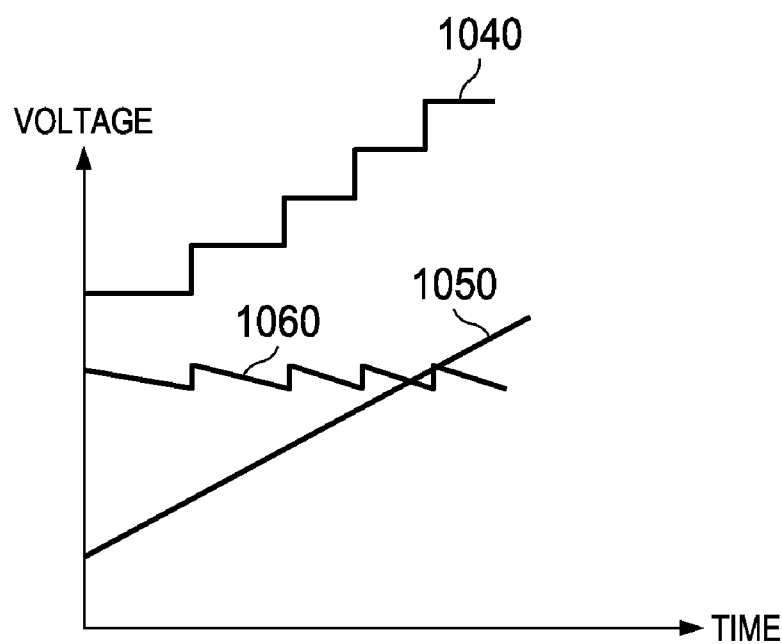
FIG. 10B is a graph illustrating the manner in which correction voltage is at discrete levels in another embodiment of the present invention.

FIGS. 10A and 10B generally illustrate graphically the correction of an input common-mode voltage. In particular, FIG. 10A illustrates correction when the correction levels are continuous. Line 1020 represents the possible input common-mode voltages selected as continuous increasing values, merely for illustration. Lines 1010 and 1030 represent the correction voltage applied and the corrected common-mode voltage respectively for the corresponding common mode voltage on line 1020.

As may be appreciated, the magnitude of correction voltage (1010) has a positive correlation with the input common mode voltage (1020) so as to maintain the corrected common mode voltage (1030) substantially constant.

FIG. 10B illustrates correction when the correction levels are discrete. Line 1050 represents the possible input common-mode voltages similar to as in line 1020. Waveforms 1040 and 1060 represent the correction voltage applied and the corrected common-mode voltage respectively. Here, the correction is applied as increasing steps and the corrected common mode voltage is maintained substantially constant as a result.

SHA 500, SHA 700 and SHA 800 thus designed, can be implemented in various devices. An example device is described below in further detail.

8. Device

Figure 11:
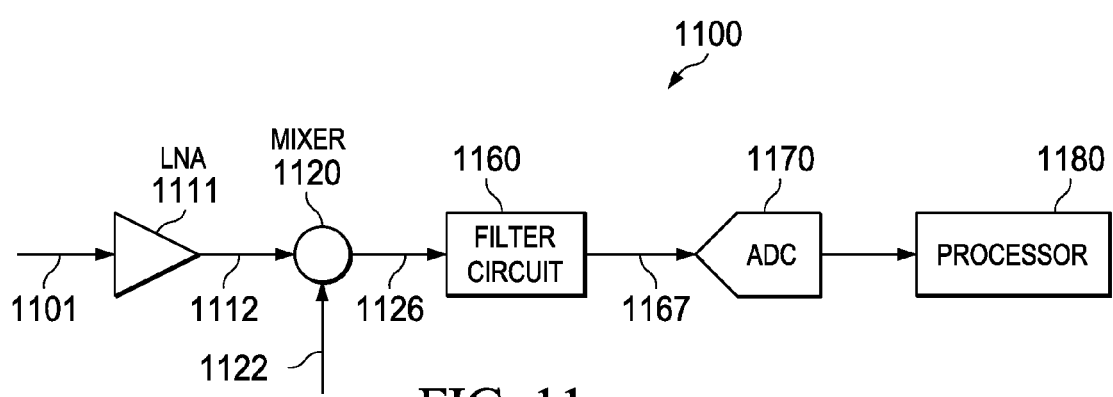
FIG. 11 is a block diagram of an example device in which various aspects of the present invention can be implemented.

FIG. 11 is a block diagram of receiver system 1100 illustrating an example system in which various aspects of the present invention may be implemented. For illustration, it is assumed that receiver system 1100 is implemented within a wireless receiver. However, receiver system 1100 can be implemented in other devices (wireless as well as wire-based communications) as well.

Receiver system 1100 is shown containing low noise amplifiers (LNA) 1110, mixer 1120, filter circuit 1160, analog to digital converter (ADC) 1170, and processor 1180. Each block/stage is described in further detail below.

LNA 1110 receives signals on path 1101 and amplifies the received signals to generate a corresponding amplified signal on path 1112. For example, in wireless systems, the signals that are transmitted from satellites, etc. may be received by an antenna (not shown) and the received signals are provided on path 1101. The received signals may be weak in strength and thus amplified by LNA 1110 for further processing. LNA 1110 may be implemented in a known way.

Mixer 1120 may be used to down-convert the received amplified signal on path 1112 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 1120 may receive the amplified signal on path 1112 and a signal of fixed frequency on path 1122 as inputs, and provides the intermediate signal on path 1126. The signal of fixed frequency on path 1122 may be generated by a phase locked loop (not shown) in a known way.

Filter circuit 1160 may correspond to a low pass filter, which allows the desired low frequencies and rejects all other unwanted high frequencies present in the signal received on line 1126. The filtered signal, which contains the frequency band of interest, is provided on path 1167.

ADC 1170 converts (samples) the filtered signal received on path 1167 to a corresponding digital value, which represents the signal of interest in received signal 1101. Processor 1180 processes the received digital values to provide various user applications and may be implemented as multiple processing units, each potentially operating independently. ADC 1170 may be implemented using various features described in sections above.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An apparatus comprising:
    at least one pair of differential input terminals that carry at least one input signal, wherein the input signal is characterized by a common mode voltage;
    a sample-and-hold amplifier coupled to each of the input terminals;
    a correction signal generator having:
        an impedance network that measures the common mode voltage of the input signal to generate an output voltage;
        a differential amplifier that is coupled to the impedance network and a reference voltage, wherein the amplifier amplifies the difference between the reference voltage and the output voltage; and
    a correction circuit having a switch that is coupled between the correction signal generator and at least one of the input terminals of the sample-and-hold amplifier, wherein the correction circuit provides at least one correction voltage from the correction signal generator to the sample-and-hold amplifier.

2. The apparatus of claim 1, wherein the impedance network further comprises a plurality of resistors coupled between the input terminals.

3. The apparatus of claim 2, wherein the plurality of resistors are coupled in series to one another.

4. The apparatus of claim 1, wherein the correction network further comprises a plurality of capacitors.

5. An apparatus comprising:
    at least one pair of differential input terminals that carry at least one input signal, wherein the input signal is characterized by a common mode voltage;
    a sample-and-hold amplifier coupled to each of the input terminals;
    a correction signal generator that is coupled to the input terminals; and
    a switching network having a plurality of switches, wherein each switch is coupled between the correction signal generator and at least one of the input terminals of the sample-and-hold amplifier.

6. The apparatus of claim 5, wherein the sample-and-hold amplifier further comprises a differential amplifier having an inverting input and a non-inverting input.

7. The apparatus of claim 5, wherein the switching network further comprises a first branch and a second branch, wherein each branch includes:
    a switching element that is coupled to the correction signal generator and a reference voltage; and
    a capacitor coupled between the switching element and one of the inverting and the non-inverting input of the first amplifier.

8. A method comprising:
    receiving an input signal at least one pair of differential input terminals, wherein said input signal is characterized by a common mode voltage; and
    sampling the input signal by a first amplifier during a sample phase;
    holding the sampled input signal by the first amplifier during a hold phase;
    measuring the common mode voltage to generate an output voltage;
    amplifying the difference between the reference voltage and the output voltage by a second amplifier; and
    actuating a switch to provide the amplified difference so as to generate a corrected signal.

9. The method of claim 8, wherein the step of measuring further comprises the steps of receiving the input signal by a voltage divider.

10. A method comprising:
- receiving an input signal at least one pair of differential input terminals, wherein said input signal is characterized by a common mode voltage; and
- sampling the input signal by a first amplifier during a sample phase;
- holding the sampled input signal by the first amplifier during a hold phase;
- applying a correction voltage through a first capacitor to one of an inverting terminal and a non-inverting terminal of the first amplifier during the hold phase;
- applying the correction voltage through a second capacitor to other one of an inverting terminal and a non-inverting terminal of the first amplifier during the hold phase; and
- applying an opposite polarity of the correction voltage to each of the inverting terminal and said non-inverting terminal of the first amplifier through first and second capacitors during a sample phase.

11. The method of claim 10, wherein the method further comprises the steps of:
- measuring the common mode voltage to generate an output voltage; and
- amplifying the difference between the reference voltage and the output voltage by a second amplifier to generate the correction voltage.

12. The method of claim 11, wherein the step of measuring further comprises the steps of receiving the input signal by a voltage divider.

13. An apparatus comprising:
- a first switch;
- a second switch;
- a voltage divider that is coupled between the first and second switches;
- a first amplifier having a first input terminal, a second input terminal, a first output terminal, and a second output terminal;
- a first capacitor that is coupled between the first switch and the first input terminal of the first amplifier;
- a second capacitor that is coupled between the first switch and the second input terminal of the first amplifier;
- a second amplifier having a first input terminals, a second input terminal, a first output terminal, and a second output terminal, wherein the first input terminal of the first amplifier is coupled to the voltage divider;
- a third switch that is coupled to the first output terminal of the second amplifier, the second output terminal of the second amplifier, and the first input terminal of the first amplifier; and
- a fourth switch that is coupled to the first output terminal of the second amplifier, the second output terminal of the second amplifier, and the first input terminal of the first amplifier.

14. The apparatus of claim 13, wherein the voltage divider further comprises:
- a first resistor that is coupled to the first switch; and
- a second resistor that is coupled between the first resistor and the second switch.

15. The apparatus of claim 13, wherein the apparatus further comprises:
- a fifth switch that is coupled between the first output terminal of the first amplifier and the first capacitor; and
- a sixth switch that is coupled between the second output terminal of the first amplifier and the second capacitor.

* * * * *